United States Patent
Yang et al.

(10) Patent No.: US 12,427,619 B2
(45) Date of Patent: Sep. 30, 2025

(54) WAFER CONVEYING DEVICE, CHEMICAL MECHANICAL PLANARIZATION APPARATUS AND WAFER CONVEYING METHOD

(71) Applicant: HANGZHOU SIZONE ELECTRONIC TECHNOLOGY INC, Zhejiang (CN)

(72) Inventors: Yuansi Yang, Zhejiang (CN); Zhipeng Zhou, Zhejiang (CN)

(73) Assignee: HANGZHOU SIZONE ELECTRONIC TECHNOLOGY INC, Zhejiang (CN)

( * ) Notice: Subject to any disclaimer, the term of this patent is extended or adjusted under 35 U.S.C. 154(b) by 410 days.

(21) Appl. No.: 17/927,895

(22) PCT Filed: Aug. 6, 2020

(86) PCT No.: PCT/CN2020/107346
§ 371 (c)(1),
(2) Date: Nov. 28, 2022

(87) PCT Pub. No.: WO2022/016623
PCT Pub. Date: Jan. 27, 2022

(65) Prior Publication Data
US 2023/0201995 A1    Jun. 29, 2023

(30) Foreign Application Priority Data
Jul. 24, 2020 (CN) .......................... 202010720439.7

(51) Int. Cl.
*H01L 21/677*   (2006.01)
*B24B 7/22*     (2006.01)
(Continued)

(52) U.S. Cl.
CPC ............ *B24B 37/345* (2013.01); *B24B 7/228* (2013.01); *B24B 37/04* (2013.01); *H01L 21/67742* (2013.01); *H01L 21/68707* (2013.01)

(58) Field of Classification Search
CPC ....... B24B 7/228; B24B 37/04; B24B 37/345; H01L 21/67742; H01L 21/68707
See application file for complete search history.

(56) References Cited

U.S. PATENT DOCUMENTS 6,361,422 B1 *  3/2002  Ettinger ............ H01L 21/67219
                                                              451/287
6,406,359 B1 *  6/2002  Birang .................. B24B 37/345
                                                              451/67
(Continued)

FOREIGN PATENT DOCUMENTS

CN    102420161    4/2012
CN    103231303    8/2013
(Continued)

OTHER PUBLICATIONS

"International Search Report (Form PCT/ISA/210) of PCT/CN2020/107346", with English translation thereof, mailed on May 8, 2021, pp. 1-6.

*Primary Examiner* — Saul Rodriguez
*Assistant Examiner* — Brendan P Tighe
(74) *Attorney, Agent, or Firm* — JCIPRNET

(57) ABSTRACT

A wafer conveying device, a chemical-mechanical planarization device and a wafer conveying method; the wafer conveying device comprises a manipulator used to clamp and transport wafers, as well as a transfer platform used to place the wafers; the manipulator consists of a $1^{st}$ claw, a $2^{nd}$ claw, a lifting platform, a movement mechanism, a rotation mechanism and a control mechanism; the transfer platform consists of a $1^{st}$ transfer platform, a $2^{nd}$ transfer platform and (Continued)

an installation rack. During wafer transmission, dry-wet wafers separation can be realized to avoid contamination to the clean wafers caused by liquids such as polishing liquid carried by the polished wafers, and to improve yield rate of the wafers.

6 Claims, 7 Drawing Sheets

(51) Int. Cl.
*B24B 37/04* (2012.01)
*B24B 37/34* (2012.01)
*H01L 21/687* (2006.01)

(56) References Cited

U.S. PATENT DOCUMENTS

| | | | | |
|---|---|---|---|---|
| 6,488,565 | B1* | 12/2002 | White | B24B 27/0076 |
| | | | | 451/41 |
| 6,562,184 | B2* | 5/2003 | Sommer | H01L 21/67766 |
| | | | | 438/692 |
| 2002/0157692 | A1* | 10/2002 | Ishihara | B08B 1/36 |
| | | | | 134/902 |
| 2008/0156351 | A1* | 7/2008 | Mitsuyoshi | H01L 21/67201 |
| | | | | 134/137 |
| 2008/0166208 | A1* | 7/2008 | Lester | H01L 21/68707 |
| | | | | 414/217 |
| 2012/0143366 | A1* | 6/2012 | Machida | H01L 21/67748 |
| | | | | 901/8 |
| 2014/0093337 | A1* | 4/2014 | Hayashi | B65G 49/00 |
| | | | | 414/225.01 |
| 2015/0357213 | A1 | 12/2015 | Yokoyama et al. | |
| 2021/0398834 | A1* | 12/2021 | Shen | H01L 21/68721 |
| 2024/0100714 | A1* | 3/2024 | Rangarajan | B24B 37/345 |

FOREIGN PATENT DOCUMENTS

| | | | | |
|---|---|---|---|---|
| CN | 109524330 A | * | 3/2019 | H01L 21/30625 |
| CN | 109585348 | | 4/2019 | |
| CN | 110026879 | | 7/2019 | |
| CN | 110176427 | | 8/2019 | |
| CN | 110534472 | | 12/2019 | |
| JP | H1022359 A | * | 1/1998 | |
| JP | 2004146447 | | 5/2004 | |
| TW | 252213 | | 7/1995 | |

* cited by examiner

WAFER CONVEYING DEVICE, CHEMICAL MECHANICAL PLANARIZATION APPARATUS AND WAFER CONVEYING METHOD

CROSS-REFERENCE TO RELATED APPLICATION

This application is a 371 of international application of PCT application serial no. PCT/CN2020/107346, filed on Aug. 6, 2020, which claims the priority benefit of China application no. 202010720439.7, filed on Jul. 24, 2020. The entirety of each of the above-mentioned patent applications is hereby incorporated by reference herein and made a part of this specification.

TECHNICAL FIELD

The present invention relates to the technical field of semiconductor integrated circuit chip manufacturing, more specifically, to a wafer conveying device. In addition, the present invention also relates to a chemical-mechanical planarization device consisting of the above wafer conveying device and a wafer conveying method applicable for the above wafer conveying device.

RELATED ART

A chemical-mechanical planarization device generally consists of a semiconductor equipment front-end module (EFEM), a cleaning unit and a polishing unit. With the existing chemical-mechanical planarization device, the wafer transmission among the polishing area and other areas is realized through a wafer exchange mechanism and a manipulator. The wafer exchange mechanism sends in and takes out the wafers by cooperating with the manipulator, and it plays a role of bridge among peripheral devices and the core parts of the chemical-mechanical planarization device.

The existing manipulator, which works in a wet environment, can only transport 1 wafer at a time, and taking out the polished wafers and sending in the to-be-polished wafers can't be conducted at the same time; the wafer exchange mechanism also can only place 1 wafer at a time, sending in and taking out the wafers into the polishing area can't be performed at the same time; therefore, the wafer transmission time is long and the wafer transmission efficiency is low. In addition, after the wafers are polished in the polishing unit, polishing liquid is attached on the surfaces of the wafers, if the time of transporting the wafers to the cleaning unit is long, dried polishing liquid will be attached on the surfaces of the wafers, and both the quality and yield rate of the waters will be affected.

To sum up, providing a wafer conveying device which can improve the wafer transmission efficiency is an urgent problem for those skilled in the art.

SUMMARY OF INVENTION

In view of above, the purpose of the present invention is to provide a wafer conveying device. Two wafer transfer platforms are arranged to respectively place dry or wet wafers; an upper claw and a lower claw are arranged on the manipulator, the upper claw and the lower claw can respectively clamp the dry wafers or the wet wafers; during wafer transmission, dry-wet wafers separation can be realized to avoid contamination to the clean wafers caused by liquids such as polishing liquid carried by the polished wafers; the upper claw and the lower claw can enter or exit the transfer platforms at the same time, the steps and waiting time required for the manipulator to transport the wafers among modules can be reduced, and the transfer efficiency can be improved.

Another purpose of the present invention is to provide a chemical-mechanical planarization device consisting of the above wafer conveying device, as well as a wafer conveying method applicable for the above wafer conveying device.

In order to achieve the above purposes, the present invention provides the following technical scheme:

A wafer conveying device consisting of a manipulator used to clamp and transport wafers, and a transfer platform used to place the wafers;

The manipulator consists of a $1^{st}$ claw, a $2^{nd}$ claw, a lifting platform used to drive the $1^{st}$ claw and the $2^{nd}$ claw to raise or drop, a movement mechanism used to drive the $1^{st}$ claw and the $2^{nd}$ claw to move horizontally, a rotation mechanism used to make the $1^{st}$ claw and the $2^{nd}$ claw rotate, and a control mechanism used to control the movements of the lifting platform, the movement mechanism, the rotation mechanism, the $1^{st}$ claw and the $2^{nd}$ claw;

The transfer platform consists of a $1^{st}$ transfer platform, a $2^{nd}$ transfer platform and installation racks.

Preferably, the $1^{st}$ transfer platform and the $2^{nd}$ transfer platform are vertically arranged up and down, the $1^{st}$ claw and the $2^{nd}$ claw are also vertically arranged up and down.

Preferably, the movement mechanism consists of an upper mechanical arm used to drive the $1^{st}$ claw to move, and a lower mechanical arm used to drive the $2^{nd}$ claw to move, both the upper mechanical arm and the lower mechanical arm are connected to the lifting platform, and the lifting platform drives the upper mechanical arm and the lower mechanical arm to raise or drop in a uniform manner.

Preferably, blocks are arranged on both the $1^{st}$ transfer platform and the $2^{nd}$ transfer platform to limit locations for placing the waters and to prevent the wafers from falling.

Preferably, one end of the $1^{st}$ transfer platform is arranged on the installation rack in a rotatable manner, and the $1^{st}$ transfer platform can rotate upward to a position with an angle of 80°~90° with the horizontal plane, so that the wafers can be placed from top onto the $2^{nd}$ transfer platform.

Preferably, at least 1 bracket is arranged on the $1^{st}$ transfer platform in a sliding manner to support the wafers;

When the brackets slide to the support position, they can be used to place the wafers clamped by the $1^{st}$ claw; when the brackets slide to the open position, the wafers can be placed from top onto the $2^{nd}$ transfer platform.

Preferably, the number of the brackets is four, among which, two of the brackets are arranged inside a $1^{st}$ slide rail in a sliding manner, and the other two brackets are arranged inside a $2^{nd}$ slide rail in a sliding manner, the $1^{st}$ slide rail and the $2^{nd}$ slide rail are arranged toward the same direction, and the $1^{st}$ slide rail and the $2^{nd}$ slide rail are respectively arranged on opposite ends of the installation racks.

A chemical-mechanical planarization device, which consists of a front-end module of a semiconductor equipment front-end module, a cleaning unit, a polishing unit, and the wafer conveying device as recited in any of the above items; the transfer platform is arranged at the entrance of a polishing module, the manipulator is arranged inside a cleaning module, a front-end module transfer platform is arranged at the exit of the semiconductor equipment front-end module, the front-end module transfer platform is used to place the to-be-polished wafers; the $1^{st}$ transfer platform of the transfer platform is used to place the wafers transported by the front-end module transfer platform and to be rotated 180°, and the $2^{nd}$ transfer platform of the transfer platform is used to place the polished wafers.

A wafer conveying method, including:
Adjust the $1^{st}$ claw and the $2^{nd}$ claw to appropriate levels through a lifting platform;
Rotate the $1^{st}$ claw and the $2^{nd}$ claw to appropriate angles through a rotation mechanism;
Move the $1^{st}$ claw right above the $1^{st}$ transfer platform and move the $2^{nd}$ claw right above the $2^{nd}$ transfer platform through a movement mechanism;
Control the $1^{st}$ claw and the $2^{nd}$ claw through a control mechanism to clamp the wafers or loosen the wafers.

Preferably, the control mechanism controls the $1^{st}$ claw and the $2^{nd}$ claw to clamp the wafers or loosen the wafers, including:
The $1^{st}$ claw loosens the clamped wafer and places it onto the $1^{st}$ transfer platform, and the $2^{nd}$ claw loosens the clamped wafer and places it onto the $2^{nd}$ transfer platform;
Or the $1^{st}$ claw loosens the clamped wafer and places it onto the $1^{st}$ transfer platform, and the $2^{nd}$ claw clamps the wafer from the $2^{nd}$ transfer platform;
Or the $1^{st}$ claw clamps the wafer from the $1^{st}$ transfer platform, and the $2^{nd}$ claw loosens the clamped wafer and places it onto the $2^{nd}$ transfer platform;
Or the $1^{st}$ claw clamps the wafer from the $1^{st}$ transfer platform, and the $2^{nd}$ claw clamps the wafer from the $2^{nd}$ transfer platform.

When using the wafer conveying device provided in the present invention, adjust the $1^{st}$ claw and the $2^{nd}$ claw to appropriate levels through the lifting platform; control the $1^{st}$ claw and the $2^{nd}$ claw to rotate through the rotation mechanism, so that the $1^{st}$ claw and the $2^{nd}$ claw drive the to-be-processed surfaces of the wafers to rotate to a targeted angle; move the $1^{st}$ claw right above the $1^{st}$ transfer platform and move the $2^{nd}$ claw right above the $2^{nd}$ transfer platform through a movement mechanism; then clamp or loosen the wafers.

Since the $1^{st}$ claw and the $2^{nd}$ claw are arranged on the manipulator, the $1^{st}$ transfer platform and the $2^{nd}$ transfer platform are arranged on the transfer platform, and the wafers are dry wafers before polishing and wet wafers after polishing, therefore, during wafer transmission, the wafers clamped by the $1^{st}$ claw can be placed on the $1^{st}$ transfer platform, and the wafers clamped by the $2^{nd}$ claw can be placed on the $2^{nd}$ transfer platform, or the wafers clamped by the $1^{st}$ claw can be placed on the $2^{nd}$ transfer platform, and the wafers clamped by the $2^{nd}$ claw can be placed on the $1^{st}$ transfer platform, so that dry-wet wafers separation can be realized to avoid contamination to the clean wafers caused by liquids such as polishing liquid carried by the polished wafers, and to improve yield rate of wafers; in addition, during wafer transmission, the $1^{st}$ claw and the $2^{nd}$ claw can clamp or loose the wafers at the same time, or one claw clamps a wafer while the other claw loosens a wafer, the frequent movement of a single claw can be avoided, and the wafer transmission efficiency can be improved.

Furthermore, the present invention also provides a chemical-mechanical planarization device consisting of the above wafer conveying device, as well as a wafer conveying method applicable for the above wafer conveying device.

BRIEF DESCRIPTION OF DRAWINGS

In order to more clearly explain the embodiments of the present invention or the technical scheme in the prior art, the drawings needed for describing the embodiments of the present invention or the prior art are briefly introduced as follows. It is Obvious that the drawings described below are only the embodiments of the present invention, and other drawings can be obtained by those skilled in the art according to the attached drawings and without creative work.

DESCRIPTION OF EMBODIMENTS

The technical schemes of the embodiments of the present invention are clearly and fully described below by combing the attached drawings. It is obvious that the embodiments described below are only certain but not all embodiments of the present invention. All the other embodiments of the present invention obtained by those skilled in the art according to the embodiments described below and without creative works belong to the protection scope of the present invention.

The core of the present invention is to provide a wafer conveying device, during clamping and loosening wafers, the $1^{st}$ claw corresponds with one of the $1^{st}$ transfer platform and the $2^{nd}$ transfer platform, the $2^{nd}$ claw corresponds with the other one of the transfer platform and the $2^{nd}$ transfer platform, so that dry-wet wafers separation can be realized to avoid contamination to the clean wafers caused by liquids such as polishing liquid carried by the polished wafers; in addition, the upper claw and the lower claw can enter or exit the transfer platforms at the same time, the steps and waiting time required for the manipulator to transport the waters among modules can be reduced, and the transfer efficiency can be improved. Another core of the present invention is to provide a chemical-mechanical planarization device consisting of the above wafer conveying device, as well as a wafer conveying method applicable for the above wafer conveying device.

Figure 1:
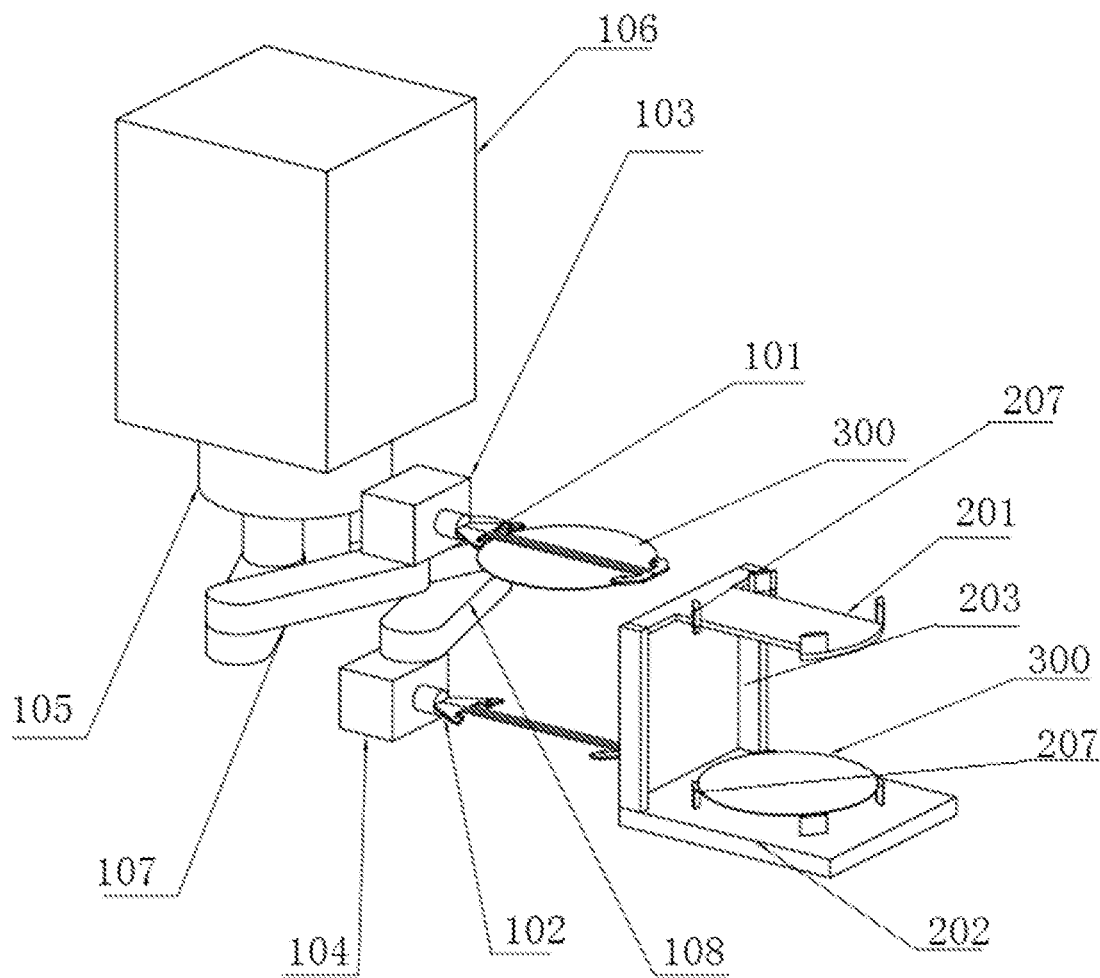
FIG. 1 is a structural view of embodiment 1 of the wafer conveying device provided in the present invention.
Figure 2:
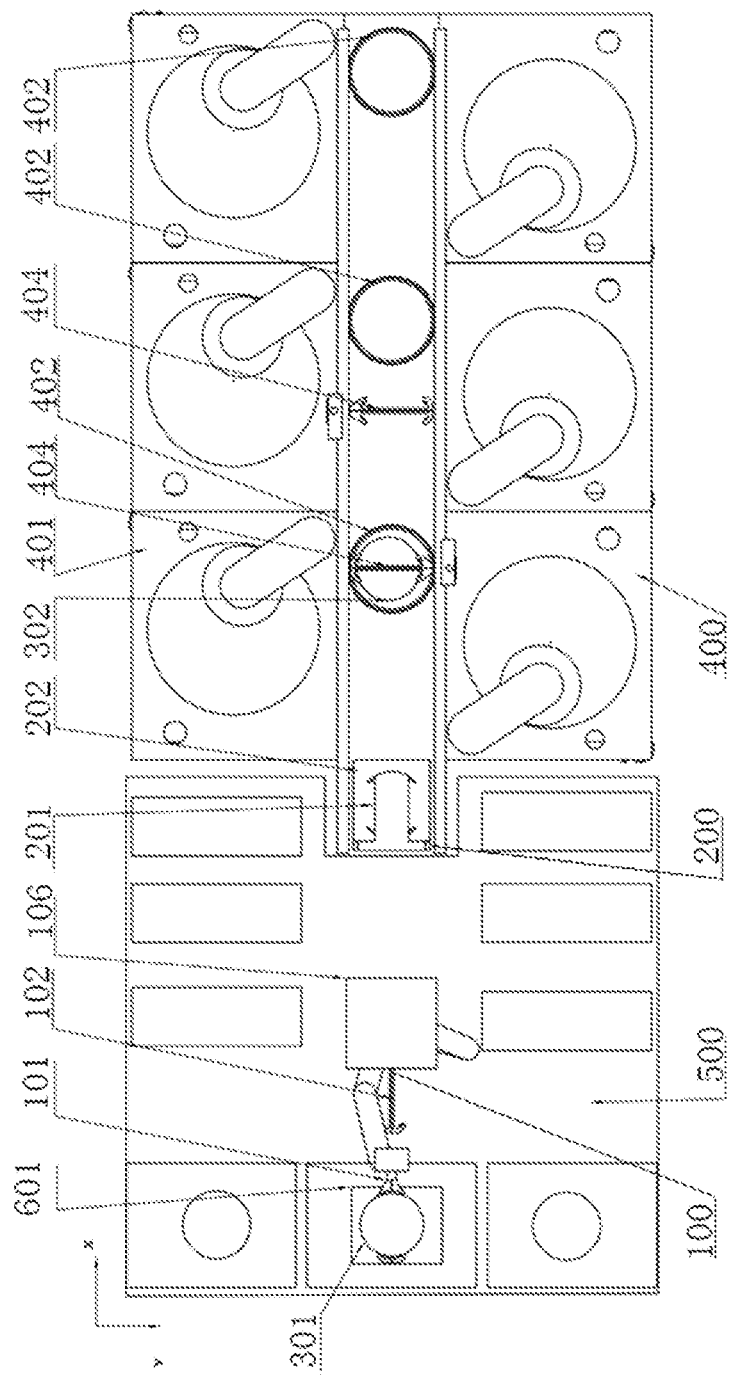
FIG. 2 is a partial structural view of the embodiment of the chemical-mechanical planarization device provided in the present invention.
Figure 3:
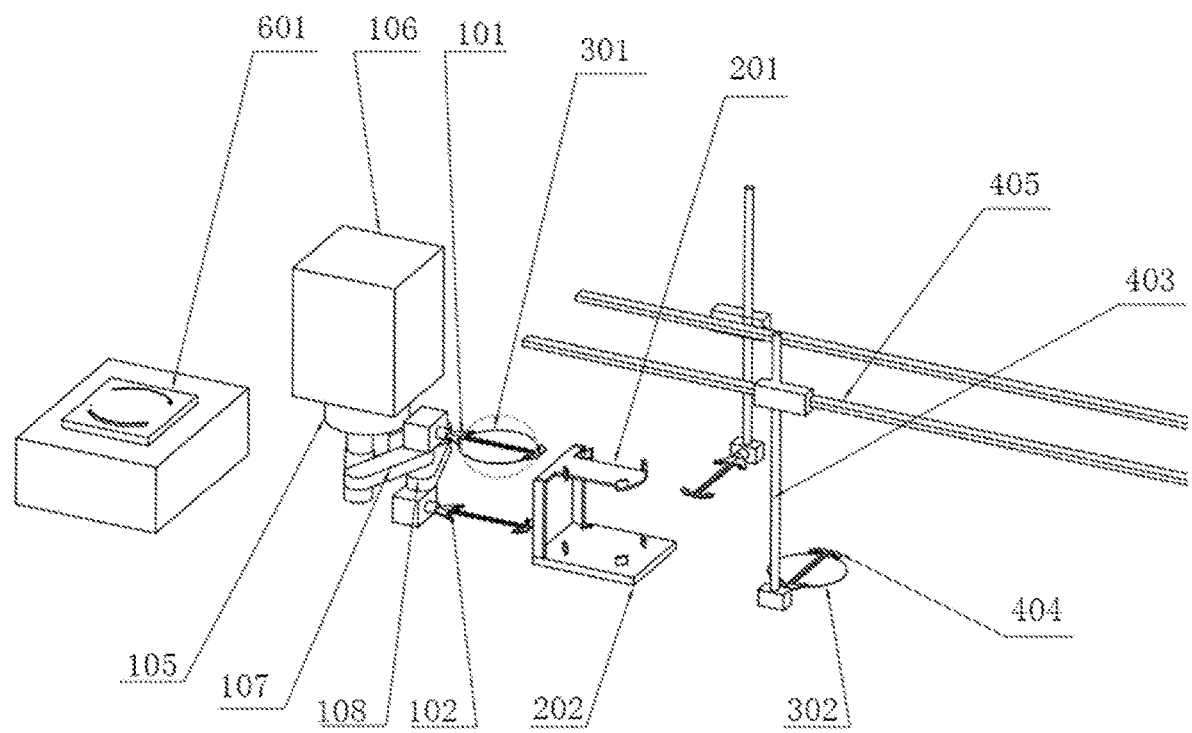
FIG. 3 is a view of the cooperation between the wafer conveying device as shown in FIG. 1 and the relevant wafer movement mechanism of the chemical-mechanical planarization device as shown in FIG. 2.
Figure 4:
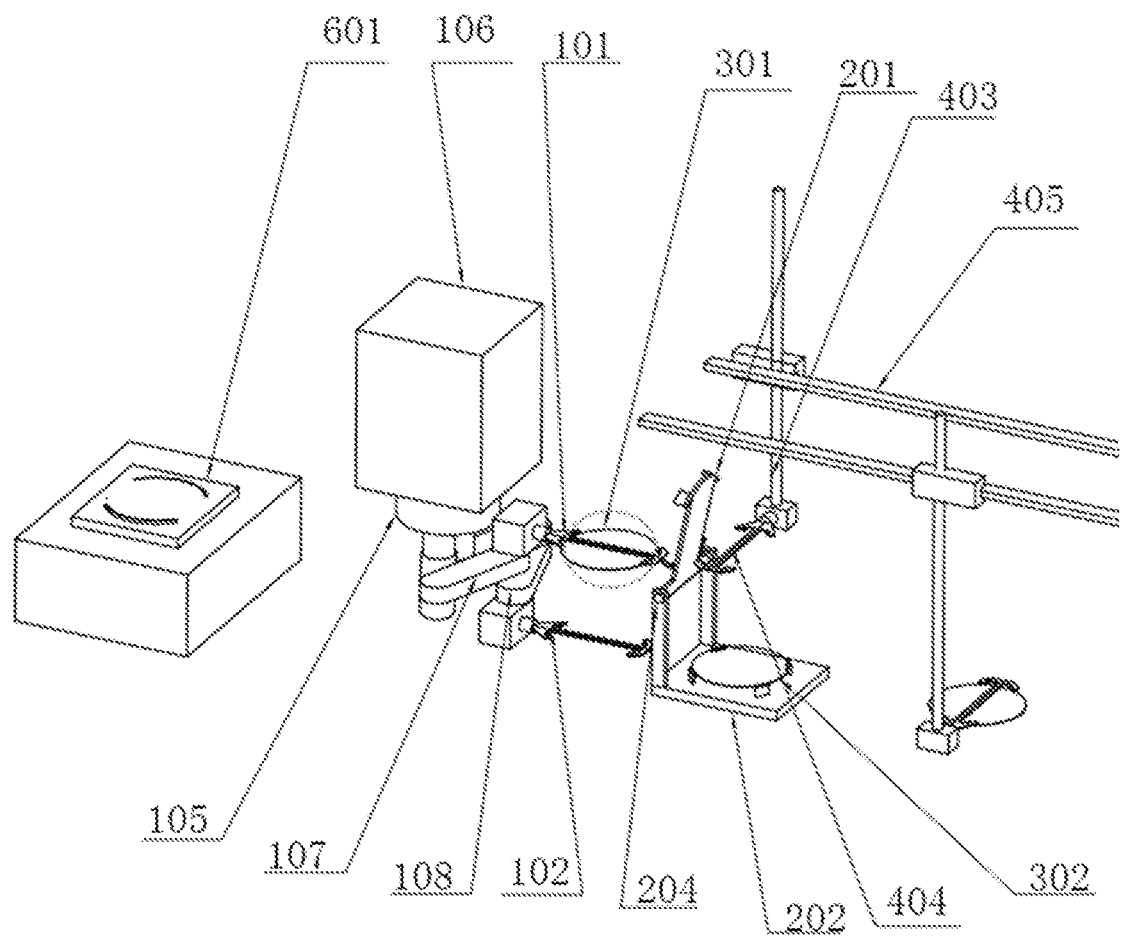
FIG. 4 is a structural view of embodiment 2 of the wafer conveying device provided in the present invention.
Figure 5:
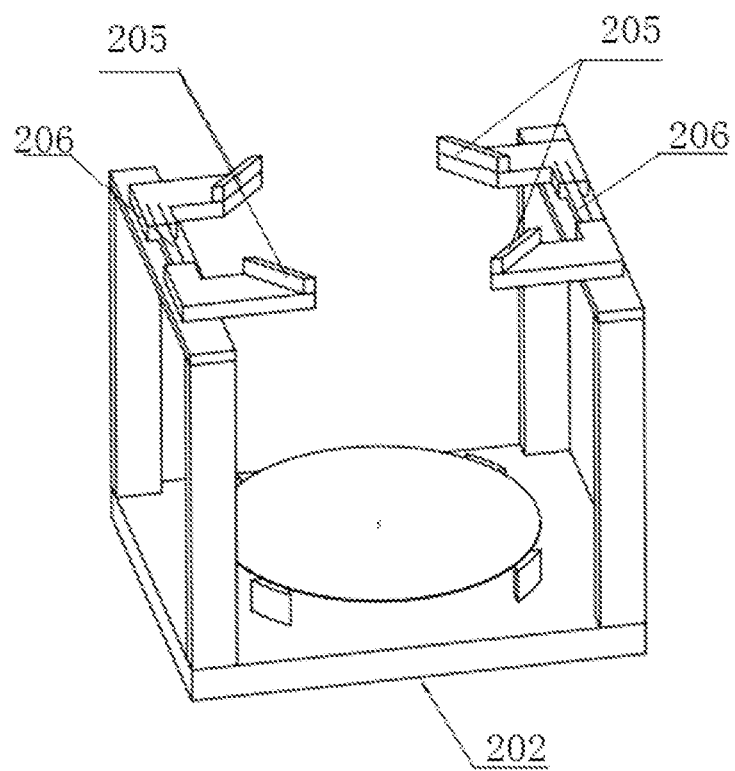
FIG. 5 is a structural view of another embodiment of the transfer platform of the wafer conveying device provided in the present invention.
Figure 6:
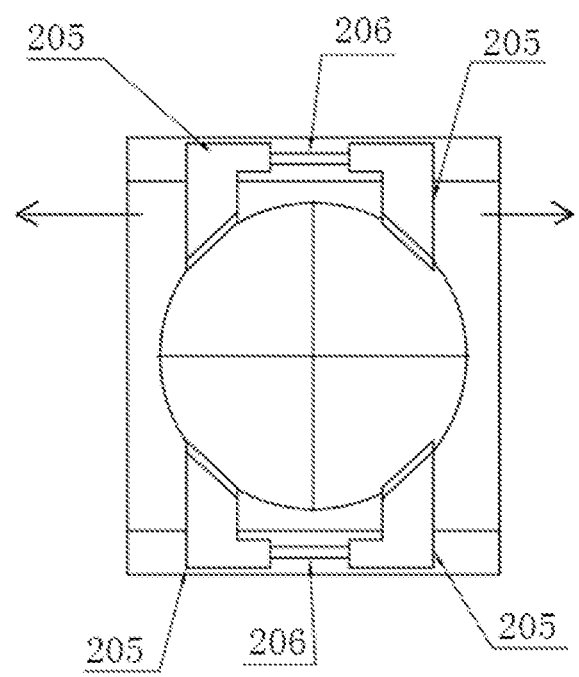
FIG. 6 is a structural view of the transfer platform (as shown in FIG. 5) clamping the wafer.
Figure 7:
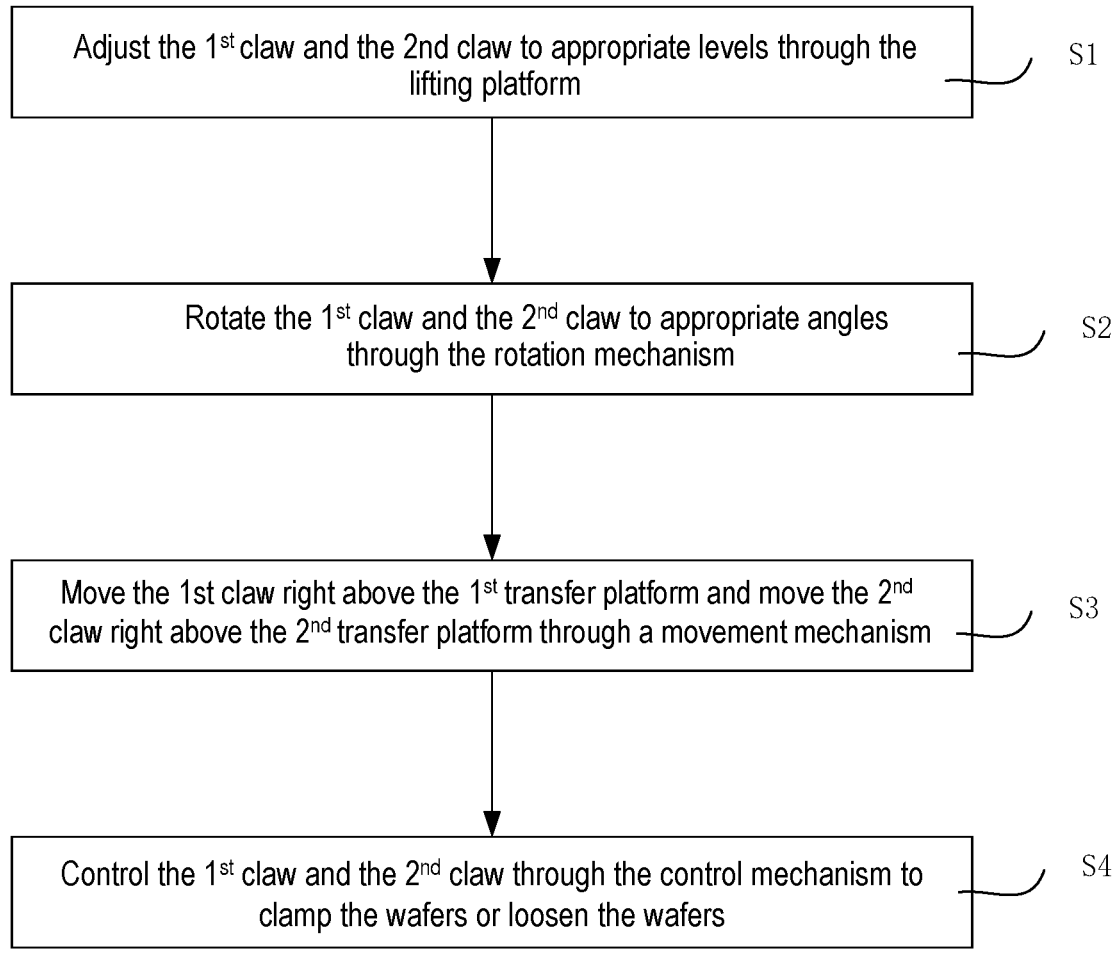
FIG. 7 is a flow chart of the wafer conveying method provided in the present invention.

Please refer to FIGS. 1~7: FIG. 1 is a structural view of embodiment 1 of the wafer conveying device provided in the present invention; FIG. 2 is a partial structural view of the embodiment of the chemical-mechanical planarization device provided in the present invention; FIG. 3 is a view of the cooperation between the wafer conveying device as shown in FIG. 1 and the relevant wafer movement mechanism of the chemical-mechanical planarization device as shown in FIG. 2; FIG. 4 is a structural view of embodiment 2 of the wafer conveying device provided in the present invention; FIG. 5 is a structural view of another embodiment of the transfer platform of the wafer conveying device provided in the present invention; FIG. 6 is a structural view of the transfer platform (as shown in FIG. 5) clamping the wafer; FIG. 7 is a flow chart of the wafer conveying method provided in the present invention.

The wafer conveying device provided in this embodiment consists of a manipulator 100 used to clamp and transport wafers 300, as well as a transfer platform 200 used to place the wafers 300; the manipulator 100 consists of a $1^{st}$ claw 101, a $2^{nd}$ claw 102, a lifting platform 105 used to drive the $1^{st}$ claw 101 and the $2^{nd}$ claw 102 to raise or drop, a movement mechanism used to drive the $1^{st}$ claw 101 and the $2^{nd}$ claw 102 to move horizontally, a rotation mechanism used to make the $1^{st}$ claw 101 and the $2^{nd}$ claw 102 rotate, and a control mechanism used to control the movements of the lifting platform 105, the movement mechanism, the rotation mechanism, the $1^{st}$ claw 101 and the $2^{nd}$ claw 102; the transfer platform 200 consists of a $1^{st}$ transfer platform 201, a $2^{nd}$ transfer platform 202 and installation racks 203.

It shall be noted that, the control mechanism can be a PLC control system or other control systems meeting the requirements, depending on actual situations; preferably, the control mechanism is arranged inside the base.

When using the wafer conveying device provided in the present invention, adjust the $1^{st}$ claw 101 and the $2^{nd}$ claw 102 to appropriate levels through the lifting platform 105; control the $1^{st}$ claw 101 and the $2^{nd}$ claw 102 to rotate through the rotation mechanism, so that the $1^{st}$ claw 101 and the $2^{nd}$ claw 102 drive the to-be-processed surfaces of the wafers 300 to rotate to a targeted angle; move the $1^{st}$ claw 101 right above the $1^{st}$ transfer platform 201 and move the $2^{nd}$ claw 102 right above the $2^{nd}$ transfer platform 202 through a movement mechanism; then clamp or loosen the wafers 300.

Clamping and loosening can be realized by: Both the $1^{st}$ claw 101 and the $2^{nd}$ claw 102 clamp the wafers 300 in advance, after reaching appropriate levels, both the $1^{st}$ claw 101 and the $2^{nd}$ claw 102 loosen the wafers 300, the wafers 300 clamped by the $1^{st}$ claw 101 are placed onto the $1^{st}$ transfer platform 201, and the wafers 300 clamped by the $2^{nd}$ claw 102 are placed onto the $2^{nd}$ transfer platform 202, or the wafers 300 clamped by the $1^{st}$ claw 101 are placed onto the $2^{nd}$ transfer platform 202, and the wafers 300 clamped by the $2^{nd}$ claw 102 are placed onto the $1^{st}$ transfer platform 201; or the wafers 300 are placed on the $1^{st}$ transfer platform 201 and the $2^{nd}$ transfer platform 202 in advance, after reaching appropriate levels, the $1^{st}$ claw 101 and the $2^{nd}$ claw 102 respectively clamp the wafers 300; or the wafers 300 are placed onto one of the $1^{st}$ transfer platform 201 and the $2^{nd}$ transfer platform 202 in advance, one of the $1^{st}$ claw 101 and the $2^{nd}$ claw 102 clamps the wafers 300 in advance, after the $1^{st}$ claw 101 and the $2^{nd}$ claw 102 reaching appropriate levels, one of the $1^{st}$ claw 101 and the $2^{nd}$ claw 102 clamping the wafers 300 loosens and places the wafers 300 onto one of the $1^{st}$ transfer platform 201 and the $2^{nd}$ transfer platform 202, the other one of the $1^{st}$ claw 101 and the $2^{nd}$ claw 102 clamps the wafers 300 from the other one of the $1^{st}$ transfer platform 201 and the $2^{nd}$ transfer platform 202.

It shall be noted that, about the rotation of the $1^{st}$ claw 101 and the $2^{nd}$ claw 102, during rotation, the wafer(s) (300) clamped by the $1^{st}$ claw 101 and/or the $2^{nd}$ claw 102 can be rotated, and the location of the wafers (300) will not be changed during rotation.

Preferably, the rotation of the $1^{st}$ claw 101 and the $2^{nd}$ claw 102 is controlled by the control mechanism, and the $1^{st}$ claw 101 and the $2^{nd}$ claw 102 can rotate synchronously or asynchronously.

Preferably, an electric control cabinet 106 can be arranged to place relevant electric control components or air circuit components.

The specific shapes of the $1^{st}$ claw 101 and the $2^{nd}$ claw 102 are not limited, as long as they can clamp the wafers 300 and loosen the clamped wafers 300.

It shall be noted that, the $1^{st}$ transfer platform 201 and the $2^{nd}$ transfer platform 202 can be arranged along the same horizontal plane or at different levels, depending on the actual situations; when the arrangement positions of the $1^{st}$ transfer platform 201 and the $2^{nd}$ transfer platform 202 are changed, the relative positions of the $1^{st}$ claw 101 and the $2^{nd}$ claw 102 shall be adjusted accordingly.

Since the $1^{st}$ claw 101 and the $2^{nd}$ claw 102 are arranged on the manipulator 100, the $1^{st}$ transfer platform 201 and the $2^{nd}$ transfer platform 202 are arranged on the transfer platform 200, and the wafers 300 are dry wafers 300 before polishing and wet wafers 300 after polishing, therefore, during wafer transmission, the wafers 300 clamped by the $1^{st}$ claw 101 can be placed on the $1^{st}$ transfer platform 201, and the wafers 300 clamped by the $2^{nd}$ claw 102 can be placed on the $2^{nd}$ transfer platform 202, so that dry-wet wafers separation can be realized to avoid contamination to the clean wafers 300 caused by liquids such as polishing liquid carried by the polished wafers 300, and to improve yield rate of wafers 300; in addition, during wafer (300) transmission, the $1^{st}$ claw 101 and the $2^{nd}$ claw 102 can clamp or loose the wafers 300 at the same time, or one claw clamps the wafers 300 while the other claw loosens the wafers 300, the frequent movement of a single claw can be avoided, and the wafer 300 transmission efficiency can be improved.

On basis of the above embodiment, the $1^{st}$ transfer platform 201 and the $2^{nd}$ transfer platform 202 can be vertically arranged up and down, the $1^{st}$ claw 101 and the $2^{nd}$ claw 102 can also be vertically arranged up and down.

The up-down arrangement can reduce the space occupied by the transfer platform 200 in the horizontal direction and improve the space utilization.

In order to respectively control the movements of the $1^{st}$ claw 101 and the $2^{nd}$ claw 102, the movement mechanism can consist of an upper mechanical arm 107 used to drive the $1^{st}$ claw 101 to move, and a lower mechanical arm 108 used to drive the $2^{nd}$ claw 102 to move, both the upper mechanical arm 107 and the lower mechanical arm 108 are connected to the lifting platform 105, and the lifting platform 105 drives the upper mechanical arm 107 and the lower mechanical arm 108 to raise or drop in a uniform manner.

Since the relative height between the $1^{st}$ transfer platform 201 and the $2^{nd}$ transfer platform 202 is generally fixed, therefore, the relative height between the $1^{st}$ claw 101 and the $2^{nd}$ claw 102 can be fixed, and the both claws can be driven by the lifting platform 105 to raise or drop in a uniform manner. During actual use, clamping is sometimes performed only by one of the $1^{st}$ claw 101 and the $2^{nd}$ claw 102, therefore, the upper mechanical arm 107 and the lower mechanical arm 108 can be respectively set to respectively control the movements of the $1^{st}$ claw 101 and the $2^{nd}$ claw 102 in the horizontal planes.

Preferably, the movement mechanism also consists of a $1^{st}$ claw seat 103 connected to the claw 101 and a $2^{nd}$ claw seat 104 connected to the $2^{nd}$ claw 102, the $1^{st}$ claw seat 103 is connected to the upper mechanical arm 107, and the $2^{nd}$ claw seat 104 is connected to the lower mechanical arm 108.

Preferably, the rotation mechanism consists of a $1^{st}$ rotation device and a $2^{nd}$ rotation device, the $1^{st}$ claw 101 is arranged inside the $1^{st}$ claw seat 103 through the $1^{st}$ rotation device, and the $2^{nd}$ claw 102 is arranged inside the $2^{nd}$ claw seat 104 through the $2^{nd}$ rotation device.

In order to prevent affecting the following procedure because of falling or position offset of the wafers 300 placed onto the 1st transfer platform 201 and the 2nd transfer platform 202, blocks 207 can be arranged on both the 1st transfer platform 201 and the 2nd transfer platform 202 to limit locations for placing the wafers 300 and to prevent the wafers 300 from falling.

On basis of the above embodiment, in order to make it convenient to place the wafers 300 onto the 2nd transfer platform 202 below, one end of the 1st transfer platform 201 can be arranged on the installation rack 203 in a rotation manner, and the 1st transfer platform 201 can rotate upward to a position with an angle of 80°~90° with the horizontal plane, so that the wafers 300 can be placed from top onto the 2nd transfer platform 202.

As shown in FIG. 4, one end of the 1st transfer platform 201 can be arranged on the installation rack 203 in a rotation manner, the 1st transfer platform 201 can rotate around a rotation shaft 204, when the polished wafers 300 need to be placed onto the 2nd transfer platform 202, the 1st transfer platform 201 can rotate upward till a position allowing a horizontal manipulator 404 of a polishing module 400 carry the polished wafers 300 from top into the transfer platform 200, the horizontal manipulator 404 clamps the polished and wet wafers 302 and raises along a vertical rail 403 to the level of the 1st transfer platform 201, the horizontal manipulator 404 moves along a horizontal rail 405 above the 2nd transfer platform 202, then the horizontal manipulator 404 moves to the 2nd transfer platform 202 and places the wet wafers 302 onto the 2nd transfer platform 202, and placing the wet wafers 302 is finished.

The arrangement of the 1st transfer platform 201 in a rotation manner can save the horizontal space occupied when transporting the wafers 300 onto the 2nd transfer platform 202, furthermore, the relative height between the 1st transfer platform 201 and the 2nd transfer platform 202, which are arranged up and down, can be flexibly adjusted during layout design.

On basis of the above embodiment, at least 1 bracket 205 can be arranged on the 1st transfer platform 201 in a sliding manner to support the wafers 300, when the brackets 205 slide to the support position, they can be used to place the wafers 300 clamped by the 1st claw 101; when the brackets 205 slide to the open position, the wafers 300 can be placed from top onto the 2nd transfer platform 202.

Preferably, the number of the brackets 205 can be four, among which, two of the brackets 205 are arranged inside a 1st slide rail in a sliding manner, and the other two brackets 205 are arranged inside a 2nd slide rail in a sliding manner, the 1st slide rail and the 2nd slide rail are arranged toward the same direction, the 1st slide rail and the 2nd slide rail are respectively arranged on opposite ends of the installation racks 203, and the 1st slide rail and the 2nd slide rail are collectively called as slide rails 206.

During use of the embodiment, when the wafers 300 need to be placed onto the 1st transfer platform 201, all of the four brackets 205 shall be controlled to slide to the support position and reach the position for supporting the edges of the wafers 300; when the wafers 300 need to be transported onto the 2nd transfer platform 202, all of the four brackets 205 shall slide to the open position in order to provide sufficient up-down movement space for clamping or placing the wafers 300, no additional space is required for clamping and placing, so that a more reasonable space design can be realized.

In addition to the wafer conveying device mentioned above, the present invention also provides a chemical-mechanical planarization device consisting of the wafer conveying device disclosed in the above embodiment, the chemical-mechanical planarization device consists of a semiconductor equipment front-end module, a cleaning unit, a polishing unit, and the wafer conveying device as recited in any of the above items; the transfer platform 200 is arranged at the entrance of a polishing module 400, the manipulator 100 is arranged inside a cleaning module 500, a front-end module transfer platform 601 is arranged at the exit of the semiconductor equipment front-end module, the front-end module transfer platform 601 is used to place the to-be-polished wafers 300; the 1st transfer platform 201 of the transfer platform 200 is used to place the wafers 300 transported by the front-end module transfer platform 601 and to be rotated 180°, and the 2nd transfer platform 202 of the transfer platform 200 is used to place the polished wafers 300. Please refer to the prior art for the structures of other parts of the chemical mechanical planarization device, which will not be described here.

As shown in FIG. 2, during the working of the chemical-mechanical planarization device, the dry, clean and unpolished wafers 301 are placed onto the front-end module transfer platform 601 and transported by the 1st claw 101 onto the 1st transfer platform 201; since the to-be-polished surfaces of the dry wafers 301 face downward on the front-end module transfer platform 601, therefore, after clamping the dry wafers 301 from the front-end module transfer platform 601, the 1st claw 101 rotates 180° under the action of the rotation mechanism, makes the to-be-polished surfaces of the dry wafers 301 face upward, then maintains the to-be-polished surfaces of the dry wafers 301 facing upward and places the dry wafers 301 onto the 1st transfer platform 201. The horizontal manipulator 404 transports the dry wafers 301 onto a stage 402 of the polishing module 400, and the polishing device 401 polishes the dry wafers 301; during the movement, the horizontal manipulator 404 moves above the 1st transfer platform 201 by moving along the horizontal rail 405 and the vertical rail 403; the horizontal manipulator 404 clamps the dry wafers 301 from the 1st transfer platform 201; after clamping, the horizontal manipulator 404 moves along the horizontal rail 405 and the vertical rail 403, and places the to-be-polished dry wafers 301 onto the stage 402. The horizontal manipulator 404 transports the wet polished wafers 302 onto the 2nd transfer platform 202, during the conveying, the horizontal manipulator 404 needs to move along the horizontal rail 405 and the vertical rail 403, the wet waters 302 can be placed from the side onto the 2nd transfer platform 202, or the wet wafers 302 can be placed from the top onto the 2nd transfer platform 202, depending on the structure of the transfer platform 200. The 2nd claw transports the wet wafers 302 to the cleaning module 500.

During use, since the 1st claw 101 and the 1st transfer platform 201 are mainly used to transport the dry and clean wafers 301, and the 2nd claw 102 and the 2nd transfer platform 202 are mainly used to transport the wet polished wafers 302, so that dry-wet separation can be realized for the 1st claw 101 and the 2nd claw 102 to avoid contamination to the clean dry wafers 301 caused by liquids such as polishing liquid.

In addition to the wafer conveying device mentioned above, the present invention also provides a wafer conveying method, including:

Step 1, adjust the 1st claw 101 and the 2nd claw 102 to appropriate levels through a lifting platform 105.

The specific structure of the lifting platform 105 is not limited in this application document, it can a combination of a motor, screws and nuts, or it can be other settings, depending on actual situations.

Step 2, rotate the $1^{st}$ claw 101 and the $2^{nd}$ claw 102 to appropriate angles through the rotation mechanism.

The rotation mechanism can drive the $1^{st}$ claw 101 and the $2^{nd}$ claw 102 to rotate synchronously, or respectively control the rotations of the $1^{st}$ claw 101 and the $2^{nd}$ claw 102, depending on actual situations.

During the rotation, the $1^{st}$ claw 101 and the $2^{nd}$ claw 102 change their angles for clamping the wafers 300, but the position of the wafers 300 will not be changed.

Step 3, move the $1^{st}$ claw 101 right above the $1^{st}$ transfer platform 201 and move the $2^{nd}$ claw 102 right above the $2^{nd}$ transfer platform 202 through the movement mechanism.

The movement mechanism can be a rod structure arranged in a hinged manner or a retractable structure, depending on actual situations, which will not be described here. During the movement, the movement mechanism can control the $1^{st}$ claw 101 and the $2^{nd}$ claw 102 move synchronously, or respectively control the movements of the $1^{st}$ claw 101 and the $2^{nd}$ claw 102.

Step 4, control the $1^{st}$ claw 101 and the $2^{nd}$ claw 102 through the control mechanism to clamp the wafers 300 or loosen the wafers 300.

The situations in the above Step 4 include: The $1^{st}$ claw 101 loosens the clamped wafers 300 and places them onto the $1^{st}$ transfer platform 201, and the $2^{nd}$ claw 102 loosens the clamped wafers 300 and places them onto the $2^{nd}$ transfer platform 202;

Or the $1^{st}$ claw 101 loosens the clamped wafers 300 and places them onto the $1^{st}$ transfer platform 201, and the $2^{nd}$ claw 102 clamps the wafers 300 from the $2^{nd}$ transfer platform 202;

Or the $1^{st}$ claw 101 clamps the wafers 300 from the $1^{st}$ transfer platform 201, and the $2^{nd}$ claw 102 loosens the clamped wafers 300 and places them onto the $2^{nd}$ transfer platform 202;

Or the $1^{st}$ claw 101 clamps the wafers 300 from the $1^{st}$ transfer platform 201, and the $2^{nd}$ claw 102 clamps the wafers 300 from the $2^{nd}$ transfer platform 202.

It shall be noted that, about the $1^{st}$ transfer platform 201 and the $2^{nd}$ transfer platform, the $1^{st}$ claw 101 and the $2^{nd}$ claw 102, the $1^{st}$ claw seat 103 and the $2^{nd}$ claw seat 104, the $1^{st}$ slide rail and the $2^{nd}$ slide rail mentioned in this application document, the $1^{st}$ and the $2^{nd}$ are only used to distinguish different positions and do not refer to order.

The embodiments are described in a progressive manner in the Description, differences of each embodiment from other embodiments are highlighted, and for the same and similar contents of the embodiments, refer to given introduction. Any combination mode of all embodiments provided in the present invention is within the protection scope of the present invention, which will not be described here.

The wafer conveying device, the chemical-mechanical planarization device and the wafer conveying method provided in the present invention are described in detail above. Both the principle and embodiments of the present invention are introduced through specific embodiments; the description of above embodiments is only used for better understanding the method and core idea of the present invention. It shall be noted that the present invention can be improved and modified by those skilled in the art under the precondition of not deviating from the principle of the prevent invention, and such improvements and modifications belong to the protection scope of the claims of the present invention.

What is claimed is:

1. A wafer conveying device, comprising a manipulator used to clamp and transport wafers, and a transfer platform used to place the wafers;

the manipulator consists of a $1^{st}$ claw, a $2^{nd}$ claw, a lifting platform used to drive the $1^{st}$ claw and the $2^{nd}$ claw to raise or drop, a movement mechanism used to drive the $1^{st}$ claw and the $2^{nd}$ claw to move horizontally, a rotation mechanism used to make the $1^{st}$ claw and the $2^{nd}$ claw rotate, and a control mechanism used to control the movements of the lifting platform, the movement mechanism, the rotation mechanism, the $1^{st}$ claw and the $2^{nd}$ claw;

the transfer platform consists of a $1^{st}$ transfer platform, a $2^{nd}$ transfer platform and installation racks, wherein the installation racks are disposed between the $1^{st}$ transfer platform and the $2^{nd}$ transfer platform, wherein the $1^{st}$ transfer platform and the $2^{nd}$ transfer platform are vertically arranged up and down, the $1^{st}$ claw and the $2^{nd}$ claw are also vertically arranged up and down, wherein:
one end of the $1^{st}$ transfer platform is arranged on the installation racks in a rotatable manner, and the $1^{st}$ transfer platform can rotate upward to a position with an angle of 80°~90° with the horizontal plane, so that the wafers can be placed from top onto the $2^{nd}$ transfer platform, or at least 1 bracket is arranged on the $1^{st}$ transfer platform in a sliding manner to support the wafers; when the brackets slide to a support position, they can be used to place the wafers clamped by the $1^{st}$ claw; when the brackets slide to an open position, the wafers can be placed from top onto the $2^{nd}$ transfer platform.

2. The wafer conveying device as recited in claim 1, wherein the movement mechanism consists of an upper mechanical arm used to drive the $1^{st}$ claw to move, and a lower mechanical arm used to drive the $2^{nd}$ claw to move, both the upper mechanical arm and the lower mechanical arm are connected to the lifting platform, and the lifting platform drives the upper mechanical arm and the lower mechanical arm to raise or drop in a uniform manner.

3. The wafer conveying device as recited in claim 1, wherein the number of the brackets is four, among which, two of the brackets are arranged inside a $1^{st}$ slide rail in a sliding manner, and the other two brackets are arranged inside a $2^{nd}$ slide rail in a sliding manner, the $1^{st}$ slide rail and the $2^{nd}$ slide rail are arranged toward the same direction, and the $1^{st}$ slide rail and the $2^{nd}$ slide rail are respectively arranged on opposite ends of the installation racks.

4. A chemical-mechanical planarization device, comprising a semiconductor equipment front-end module, a cleaning unit, a polishing unit, and the wafer conveying device as recited in claim 1; the transfer platform is arranged at the entrance of a polishing module, the manipulator is arranged inside a cleaning module, a front-end module transfer platform is arranged at the exit of the semiconductor equipment front-end module, the front-end module transfer platform is used to place the to-be-polished wafers; the $1^{st}$ transfer platform of the transfer platform is used to place the wafers transported by the front-end module transfer platform and to be rotated 180°, and the $2^{nd}$ transfer platform of the transfer platform is used to place the polished wafers.

5. A wafer conveying method, comprising:
adjusting a $1^{st}$ claw and a $2^{nd}$ claw to appropriate levels through a lifting platform;
rotating the $1^{st}$ claw and the $2^{nd}$ claw to appropriate angles through a rotation mechanism;

moving the $1^{st}$ claw right above a $1^{st}$ transfer platform and moving the $2^{nd}$ claw right above a $2^{nd}$ transfer platform through a movement mechanism;

controlling the $1^{st}$ claw and the $2^{nd}$ claw through a control mechanism to clamp the wafers or loosen the wafers, wherein installation racks are disposed between the $1^{st}$ transfer platform and the $2^{nd}$ transfer platform, wherein the $1^{st}$ transfer platform and the $2^{nd}$ transfer platform are vertically arranged up and down, the $1^{st}$ claw and the $2^{nd}$ claw are also vertically arranged up and down, wherein:

one end of the $1^{st}$ transfer platform is arranged on the installation racks in a rotatable manner, and the $1^{st}$ transfer platform can rotate upward to a position with an angle of 80°~90° with the horizontal plane, so that the wafers can be placed from top onto the $2^{nd}$ transfer platform, or at least 1 bracket is arranged on the $1^{st}$ transfer platform in a sliding manner to support the wafers; when the brackets slide to a support position, they can be used to place the wafers clamped by the $1^{st}$ claw; when the brackets slide to an open position, the wafers can be placed from top onto the $2^{nd}$ transfer platform.

6. The wafer conveying method as recited in claim 5, wherein the control mechanism controls the $1^{st}$ claw and the $2^{nd}$ claw to clamp the wafers or loosen the wafers, including:

the $1^{st}$ claw loosens the clamped wafers and places them onto the $1^{st}$ transfer platform, and the $2^{nd}$ claw loosens the clamped wafers and places them onto the $2^{nd}$ transfer platform;

or the $1^{st}$ claw loosens the clamped wafers and places them onto the $1^{st}$ transfer platform, and the $2^{nd}$ claw clamps the wafers from the $2^{nd}$ transfer platform;

or the $1^{st}$ claw clamps the wafers from the $1^{st}$ transfer platform, and the $2^{nd}$ claw loosens the clamped wafers and places them onto the $2^{nd}$ transfer platform;

or the $1^{st}$ claw clamps the wafers from the $1^{st}$ transfer platform, and the $2^{nd}$ claw clamps the wafers from the $2^{nd}$ transfer platform.

\* \* \* \* \*